United States Patent
Riaziat et al.

(10) Patent No.: US 6,920,161 B2
(45) Date of Patent: Jul. 19, 2005

(54) HIGH-SPEED TO-CAN OPTOELECTRONIC PACKAGES

(75) Inventors: Majid Leondard Riaziat, San Jose, CA (US); Ching-Kung Tzuang, Hsin-Chu (TW); Yi-Ching Pao, Los Gatos, CA (US)

(73) Assignee: OEPic Semiconductors, Inc., Sunnyvale, CA (US)

( * ) Notice: Subject to any disclaimer, the term of this patent is extended or adjusted under 35 U.S.C. 154(b) by 301 days.

(21) Appl. No.: 10/212,011

(22) Filed: Aug. 2, 2002

(65) Prior Publication Data

US 2003/0138008 A1 Jul. 24, 2003

Related U.S. Application Data

(60) Provisional application No. 60/350,610, filed on Jan. 18, 2002.

(51) Int. Cl.[7] .................................................. H01S 3/04
(52) U.S. Cl. ........................................... 372/36; 372/34
(58) Field of Search ............................. 372/36, 38.02, 372/43–50, 33, 34, 109, 22

(56) References Cited

U.S. PATENT DOCUMENTS

| | | | |
|---|---|---|---|
| 4,949,930 A | 8/1990 | Van Duser | 248/421 |
| 5,235,248 A | 8/1993 | Clark et al. | 315/5.51 |
| 5,537,504 A | 7/1996 | Cina et al. | 385/93 |
| 5,744,848 A | 4/1998 | Harazono | 257/433 |
| 5,838,703 A | 11/1998 | Lebby et al. | 372/43 |
| 5,974,066 A * | 10/1999 | Wu et al. | 372/43 |
| 6,031,253 A | 2/2000 | Kobayashi | 257/99 |
| 6,074,102 A | 6/2000 | Oikawa | 385/88 |
| 6,227,723 B1 | 5/2001 | Masuda et al. | 385/88 |
| 6,301,278 B2 * | 10/2001 | Uchida | 372/36 |
| 6,302,596 B1 | 10/2001 | Cohen et al. | 385/93 |
| 6,314,117 B1 | 11/2001 | Heim et al. | |
| 6,420,205 B1 | 7/2002 | Sawai | 438/65 |
| 6,426,591 B1 | 7/2002 | Yanagisawa et al. | 313/512 |
| 6,526,078 B2 | 2/2003 | Lee | 372/31 |
| 6,527,460 B2 | 3/2003 | Cohen et al. | 385/94 |
| 6,542,647 B2 | 4/2003 | Minemoto et al. | 385/6 |
| 6,611,541 B2 | 8/2003 | Rookes et al. | 372/38.02 |
| 6,654,394 B1 | 11/2003 | Sellin et al. | 372/32 |
| 2001/0017964 A1 | 8/2001 | Setoguchi | 385/88 |
| 2001/0021054 A1 * | 9/2001 | Lee | 359/163 |
| 2002/0090013 A1 | 7/2002 | Murry et al. | 372/36 |
| 2002/0141142 A1 | 10/2002 | Rookes | |
| 2002/0180956 A1 | 12/2002 | Barker | 356/121 |
| 2002/0181522 A1 | 12/2002 | Rookes et al. | |
| 2003/0002547 A1 | 1/2003 | Lee | 372/36 |
| 2003/0002826 A1 | 1/2003 | Cohen et al. | 385/94 |
| 2003/0020998 A1 | 1/2003 | Kuczynski | 359/245 |
| 2003/0021310 A1 | 1/2003 | Harding | |
| 2003/0043868 A1 * | 3/2003 | Stewart et al. | 372/36 |
| 2003/0086243 A1 | 5/2003 | Harding | 361/700 |
| 2003/0099273 A1 | 5/2003 | Murry et al. | 372/108 |

FOREIGN PATENT DOCUMENTS

| | | |
|---|---|---|
| JP | 02 222185 A | 9/1990 |
| JP | 05 110201 A | 4/1993 |
| JP | 07 122808 A | 5/1995 |

OTHER PUBLICATIONS

Ariga et al., 10Gbps Operation of TO–Can Packaged 850nm Oxide Confined VCSEL, Yokohama R & D Lab., The Furukawa Electric Co., Ltd, paper No. Th13, pp. 726–727, 2001.

Ebberg et al., High Performance Optical Receiver Module for 10Gbit/s Applications with Low Cost Potential, Electronics Letters, vol. 36, No. 8, Apr. 13, 2000.

Ebberg et al., 10Gbit/s Transmission Using Directly Modulated Uncooled MQW Ridge Waveguide DFB Lasers in TO Package, Electronics Letters, vol. 36, No. 17, Aug. 17, 2000.

Active Devices: VCSELs Shift Focus to 10 Gbit/s Market, FiberSystems International, p. 39, Nov. 2001.

* cited by examiner

*Primary Examiner*—Minsun Oh Harvey
*Assistant Examiner*—Tuan N. Nguyen
(74) *Attorney, Agent, or Firm*—Wilson, Sonsini Goodrich & Rosati

(57) ABSTRACT

Various methods and apparatuses extend the useful operation speed of TO-can optoelectronic packages up to speeds of 10 Gbps and beyond.

52 Claims, 22 Drawing Sheets

HIGH-SPEED TO-CAN OPTOELECTRONIC PACKAGES

CROSS REFERENCE TO RELATED APPLICATION

This application claims the benefit of U.S. Provisional Application No. 60/350,610, filed Jan. 18, 2002, and is hereby incorporated by reference.

BACKGROUND

The present invention pertains to semiconductor laser packages, transmitters, and receivers, and more particularly to the packaging of a plurality of optoelectronic components within TO-can package configurations.

Lasers are used for many purposes particularly in the telecommunications industry. Edge emitting lasers are the most common. They are available for all major telecommunication wavelengths and multiple types are available for various applications. Vertical cavity surface emitting lasers (VCSELs) generally offer a low-cost alternative and are capable of being fabricated in larger volumes on semiconductor wafers. These lasers, which emit light vertically from the surface of a fabricated wafer, combine the surface emission and low production cost as with light-emitting diodes (LEDs), and provide the necessary speed and power for many laser applications. VCSELs operating at wavelengths at 850 nm are often selected today as laser sources for commercial 10 Gigabit Ethernet networks and optical backplane systems.

A widely accepted package for VCSELs and edge emitting lasers is commonly known as TO-style or TO-can packages. Many conventional semiconductor laser apparatus utilize a metal or composite TO-can package for optoelectronic packaging, which includes a can and header assembly that is formed with a window or lens. The laser emissions from a laser contained within the package passes through the header or cap portion of the TO-can. The TO-can design has been used to package electronic devices since the early days of transistor technology and include characteristic features such as these windowed tops and related fiber pigtailing. The wide availability of relatively inexpensive TO-can parts and packaging services makes it a very attractive package for optoelectronic devices. Presently, relatively small TO-cans such as TO-18, TO-46 or TO-56 are used for optoelectronic packaging that accommodate data rates as high as 2.5 and 3.3 Gbps. The TO-can package however was not originally designed for relatively high Gbps speeds. High-speed optoelectronic devices have primarily relied on other more expensive laser packaging solutions such as butterfly modules.

The parasitic reactance associated with the construction of a TO-can package limited its operation for high-speed applications in the past. Speeds of up to a few gigabits per second have been achieved by implementing a "differential" drive approach well known in the art. This approach minimizes the effect of the parasitics associated with the grounding of the package. A virtual ground is established that limits current flow through the physical ground. Maintaining the balance between the differential signals is crucial however and this task gets progressively more difficult at higher speeds. Moreover, TO-can packages generally employ bond wires for connecting various optoelectronic components and posts which may further contribute to the undesirable parasitic effects often associated with these types of packages at high data rates. The current lack of adequate solutions for addressing these limitations can not meet the growing demand for high-speed digital communications services which now require optical transmission links to operate at data rates of 10 Gbps and higher.

Early transistors were packaged in metal cans. The "transistor outline package" or the "TO-can" was the first transistor package standardized by the JEDEC organization in 1960's. (JEDEC: Joint Electron Devices Engineering Council was formed in 1958.) As optoelectronic semiconductor devices such as photodetectors became available, these components were housed in TO-cans with optical windows. Although the TO-can was not originally intended to be used with high-speed modulation, it has supported increasing rates of modulation over the years. Currently, small TO-cans such as TO-46 are widely used in optoelectronic packaging at data rates as high as 2.5 and 3.3 Gbps. The wide availability of inexpensive TO-can parts and packaging services makes it a very attractive package for optoelectronic devices.

SUMMARY

Figure 1A:
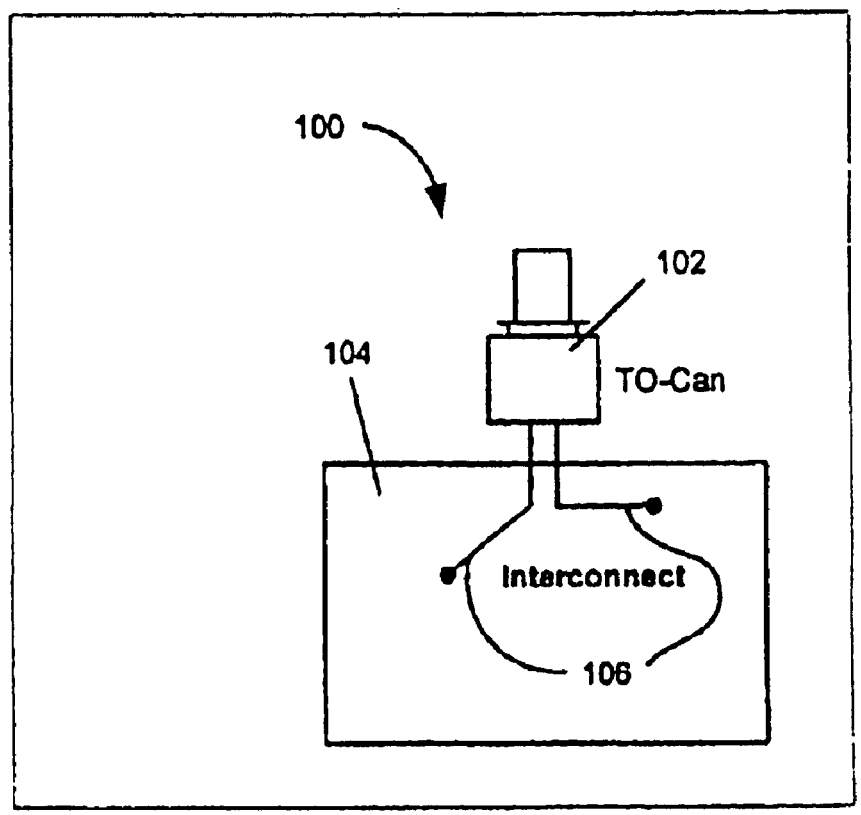
FIGS. 1(a) and (c) illustrate the device placement and PC board assembly of a TO-can package in a conventional configuration that is provided herein.

It is an object of the invention to provide high-speed TO-can packaging for semiconductor lasers, transmitters, receivers, and other optoelectronic components. The cost-effective improvements described herein may further promote the continued success of TO-can packaging in the marketplace as a desirable choice for current high-speed applications demanding data rates of 10 Gbps and greater.

The following is a basic summary of various aspects of the invention which may be applied separately or collectively in achieving a TO-can package for applications requiring high-speed data transfer rates of up to 10 Gbps and beyond:

1. Cutting the external TO-can posts short, connecting the posts directly to controlled impedance transmission lines, and grounding the TO-can as well as possible.
2. Decrease inductance below, for example, 600 picoHenries in an electrical path from the laser or photodetector to the post. For example, keeping bond wires inside the TO-can compartment relatively short by incorporating transmission lines as interconnects. Some other examples of decreasing inductance in the electrical path include at least two parallel bond wires, a bond ribbon, and/or multiple bond wires and at least capacitor in series with the capacitor(s) coupled to ground. The bond wire can be less than 500 micrometers in total length, and/or have one or more diameters exceeding 17 microns. The transmission line can be 50 ohms or some other defined impedance for some frequency range and/or include a coplanar waveguide.
3. Combining interconnect transmission lines and other necessary components such as power monitor diode(s) and/or mirror(s) on the same submount for the active device. The transmission line and/or other components may be mounted or formed on the submount. Examples of forming include, for example, forming with the semiconductor material of the submount and/or metallization.
4. Including signal conditioning and/or bandwidth broadening circuitry such as filters also either on the same submount as other TO-can components or on the PC board. For example, a lowpass filter can be partly on the PCB and partly include at least one post of the TO-can, and/or a coplanar waveguide bandpass filter can be on the PCB coupled to at least one post of the TO-can. These principles may be applied to various TO-can packages including TO-18, TO-46 and TO-56 style packages for edge emitting devices and vertically emitting devices, which may involve modifications specific to such configurations as described herein. The TO-can package can include any number posts, such as 4 posts, 5 posts, or more posts, or fewer posts. The invention may be generally applied to various laser packages and TO-can packaging known in the art such as those described in the following issued patents which are incorporated by reference in their entirety: U.S. Pat. No. 5,838,703 entitled Semiconductor Laser Package with Power Monitoring System and Optical Element; U.S. Pat. No. 6,001,664 entitled Method for Making Closely-Spaced VCSEL and Photodetector on A Substrate; U.S. Pat. No. 6,302,596 entitled Small Form Factor Optoelectronic Transceivers; and U.S. Pat. No. 6,314,117 entitled Laser Diode Package.

DETAILED DESCRIPTION OF THE INVENTION

FIG. 1(a) illustrates the conventional placement and assembly 100 of a TO-can package 102 on a PC board 104. The TO-can package 102 may be coupled to multiple interconnects 106 for communication with the board. The TO-can package 102 basically comprises a header base and a cap or cover structure that is formed with a window through which light passes. The window may be formed with a lens or other optical element. The TO-can type package 102 provides an enclosure that serves to protect VCSEL components and other contents such as photodetectors or photodiode monitors. The TO-can laser package may include a ground post and one or more signal lines for connection to the PC board 104. Portions of the signal lines may be metallized and formed directly on the board. A top view illustration of the interior region of the TO-can 140 is also provided in FIG. 1(c). The package base may be connected to a ground post for the package and a plurality of signal lines or posts. The TO-can 140 may include a ground post 142, and multiple signal posts 144, 146, and 148. A VCSEL 150 maybe coupled to signal post 146 with a bond wire 152 as shown. One or more posts may be selected for connection to various optoelectronic components contained within the package. Posts may pass through openings formed in the TO-can base and may be positioned with surrounding glass feed-throughs or other dielectric material. The VCSEL may be also positioned in the proximity of the center region of the can base that is connected to its corresponding signal post with a bond wire, or a ribbon wire which tends to have less inductance than round bond wires.

Figure 1B:
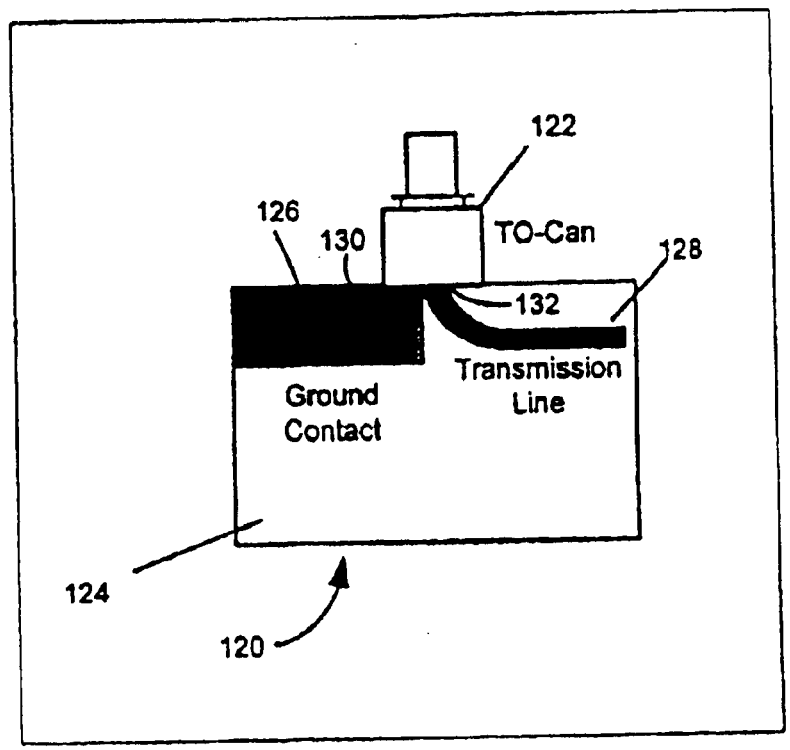
FIGS. 1(b) and (d) illustrate the device placement and PC board assembly of a TO-can package in a high-speed configuration that is provided herein.
Figure 1C:
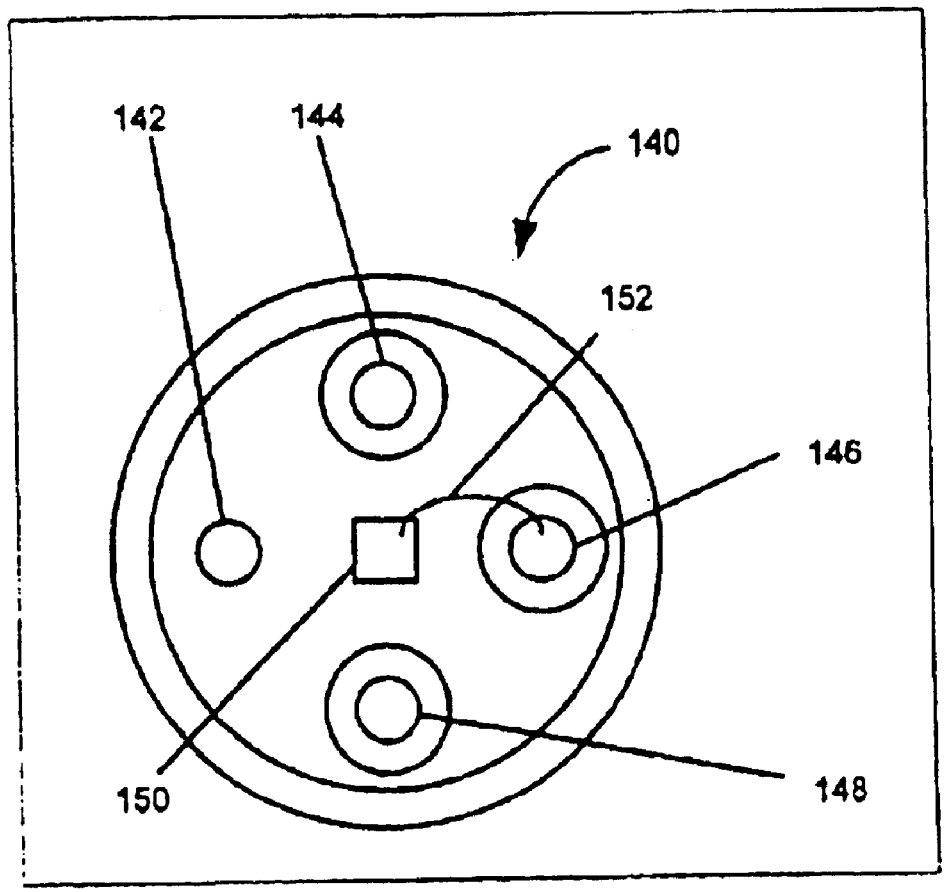
Figure 1D:
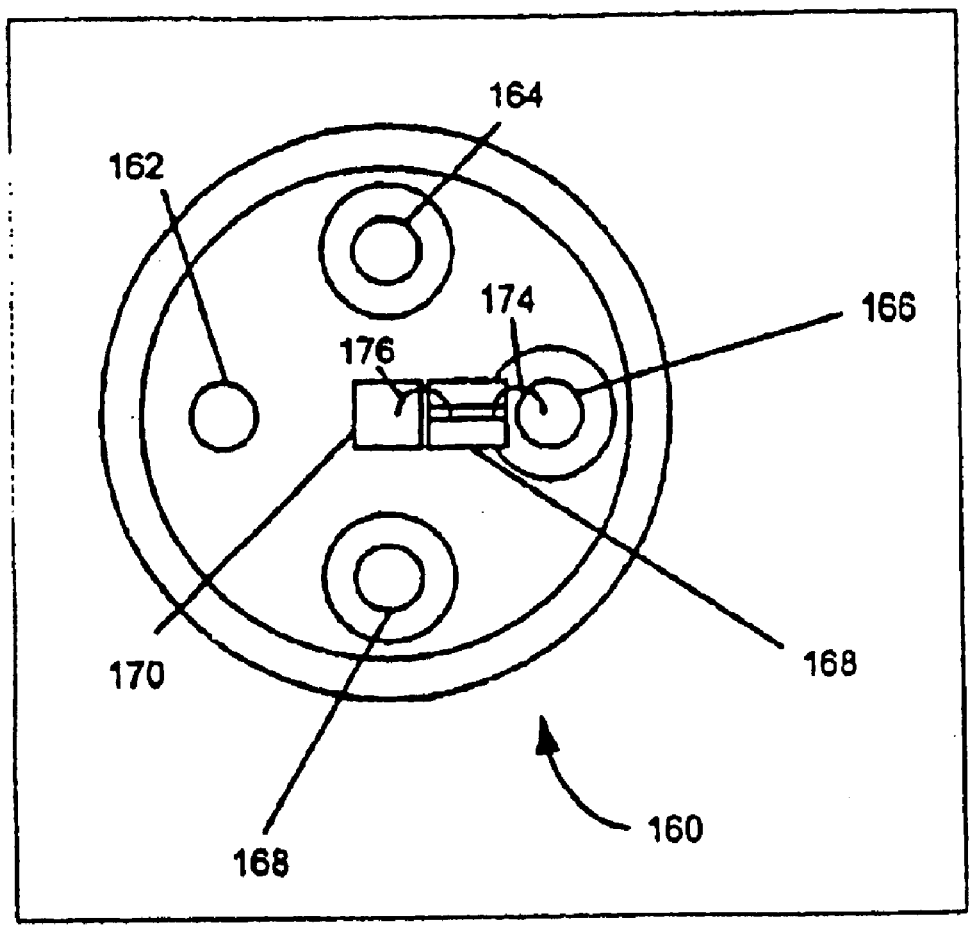

FIG. 1(b) provides an embodiment of a TO-can package formed in accordance with the concepts of the invention described herein. The TO-can package 122 is connected and mounted to a PC board 124 to provide a TO-can package and board assembly 120. The TO-can package 122 may be formed with a ground post 130 that is coupled to a ground contact 126 and a transmission line 128 as described herein. External parasitics were minimized or substantially reduced by shortening the length of the package posts and practically eliminating or eliminating the physical gap between the TO-can package 122 and the board 124. The substantially shortened ground post 130 may be positioned adjacent to the ground contact or plate 126. The ground contact or plate 126 is needed very close to the edge of the PC board 124 to minimize the length of the ground post 130. Moreover, external parasitics were significantly reduced by installing a transmission line substantially along a portion of the interconnect wire. Examples of transmission lines include the microstrip and the coplanar waveguide. Mounting the TO-can package 122 on the edge of a PC board with controlled-impedance transmission lines extremely close to the TO-can package produces a desired reduction in parasitics as described herein. The transmission line 128 on the PC board may be selected for connection to its signal post 132 in accordance with the invention along a substantial length of the board in place of a conventional post to further reduce external parasitics. FIG. 1(*d*) also includes a top view diagram of the interior of a TO-can package 160. The TO-can package 160 includes a ground post 162, and signal posts 164, 166, and 168. The VCSEL 170 may be coupled to the signal post 166 with a transmission line 172 and a pair of relatively shortened bond wires on either end. In some embodiments of the invention, the transmission line 172 is formed as a 50 ohm microstrip. A bond wire 174 may connect the transmission line 172 to the signal post 166, and another bond wire 176 may couple the transmission line 172 to the VCSEL 176. The installation of the transmission line 172 essentially reduces the total length of bond wire used in this embodiment of the invention. Internal parasitics within a TO-can package is therefore reduced significantly when selecting a transmission line. High-speed connections traditionally made using bond wires for lasers within TO-can packages may be replaced with transmission line assemblies as described herein in accordance with the invention.

Speed Limitation Comparison

A comparison between TO-can package posts connected with bond wiring alone is provided below against those using a transmission line and shortened bond wires as described herein. Speed limitations of a conventional TO-can package are highlighted below when compared against packages modified in accordance with the invention. To begin the experimentation, the external posts of two TO-cans packages (Can #1 and Can #2) were substantially shortened and edge-mounted on PC boards with 50 ohm transmission lines extending to the posts. Eliminating or reducing the offset distance to the PC board extends the acceptable performance of the TO-can to approximately 7 GHz. Reducing bond-wire lengths further extends its performance to approximately 12 GHz. The inductance and capacitance of the packaging were minimized by keeping the posts to the TO-can as short as possible. Some embodiments include optoelectronic transmit and receive modules in TO-cans that operate at data rates as high as 12.5 Gbps.

Figure 2:
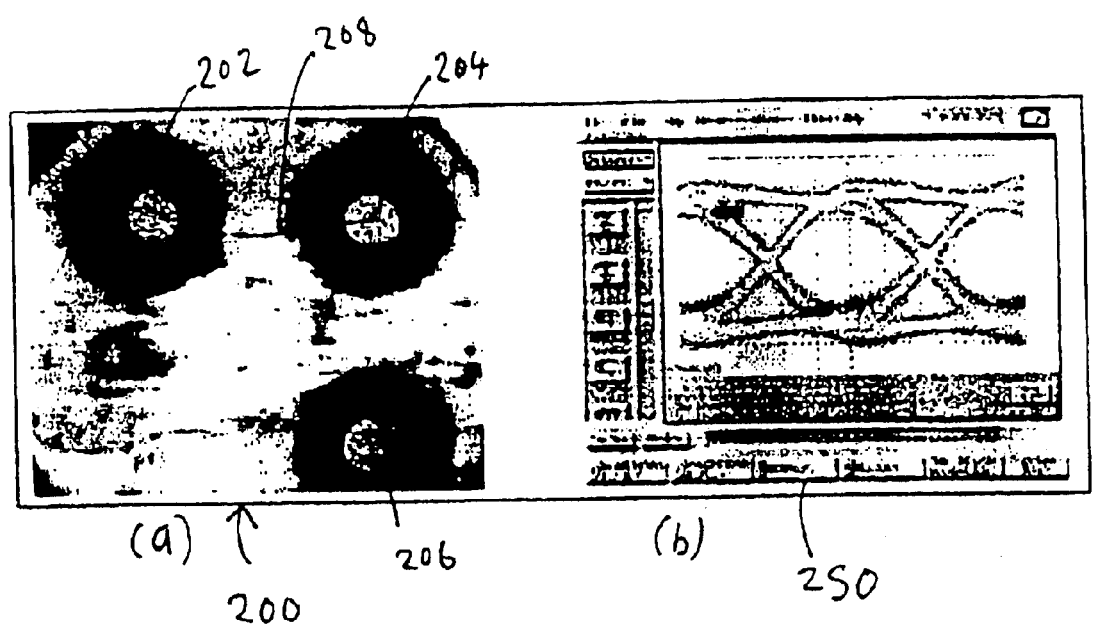
FIG. 2(a) is a top view illustration of a TO-can package with posts connected with a conventional bond wire.
FIG. 2(b) is a 12 Gbps eye-diagram for the TO-can package of FIG. 2(a).
Figure 3:
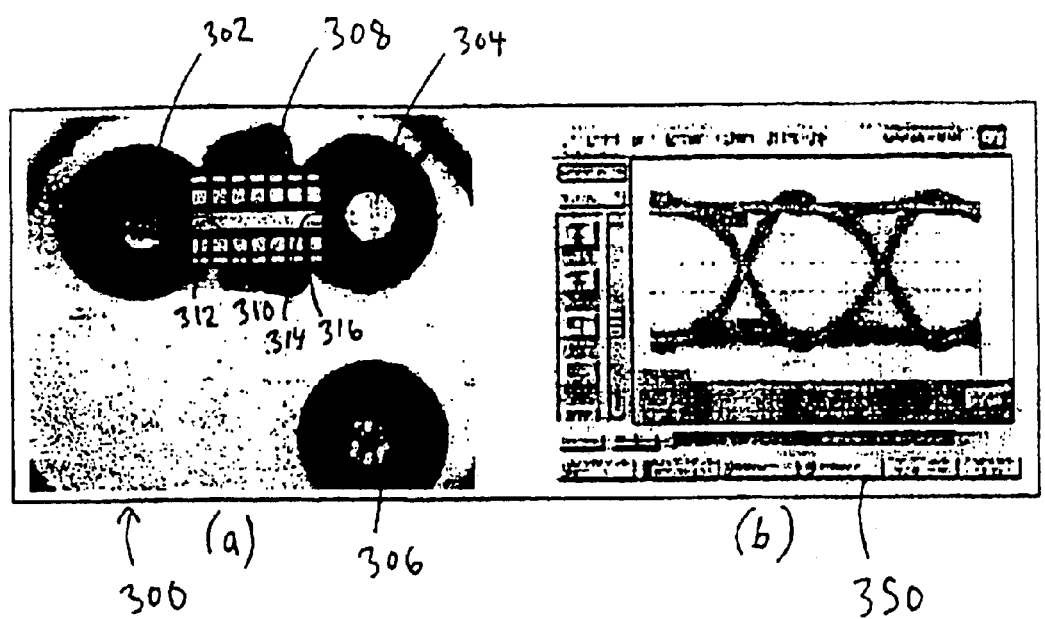
FIG. 3(a) is a top view illustration of a TO-can package with posts connected with a transmission line formed in accordance with the invention.
FIG. 3(b) is a 12 Gbps eye-diagram for the TO-can package of FIG. 3(a).

In Can #1 200, two adjacent signal posts 202 and 204 were connected with a single bond wire 208 as shown in FIG. 2(*a*). FIG. 2(*b*) provides an eye diagram 250 for Can #1 which includes a conventional bond wire as shown in FIG. 2(*a*). The eye diagram 250 is provided at 12 Gbps with a measured risetime of 73 picoseconds. In Can #2 300, a transmission line 308 is installed between two adjacent posts 302 and 304 and connected with relatively short bond wires to each post as shown in FIG. 3(*a*). Can #2 300 may include a plurality of signal posts 302, 304, and 306. Two bond wires 310 and 312 may couple the transmission line 308 and the signal post 302. Additional bond wires 314 and 316 may couple the transmission line 308 and the other signal post 304. FIG. 3(*b*) shows an eye diagram 350 of the TO-can design illustrated in FIG. 3(*a*) which is modified in accordance with the invention. The corresponding eye diagram 350 is also provided at 12 Gbps with a measured risetime of 36 picoseconds. Eye diagrams such as these shown can be generated by an oscilloscope and is basically a plot of wave amplitude versus time. The vertical opening of the eye indicates the margin for bit errors due to noise, and the horizontal opening of the eye indicates the margin for timing errors due to an imperfectly recovered clock. Lower rise times are generally desired which are evidenced by a larger "center eye" portion in the eye diagram. Can #2 thus provides the more desirable results as illustrated by the relatively larger center eye in its corresponding eye-diagram.

Figure 4:
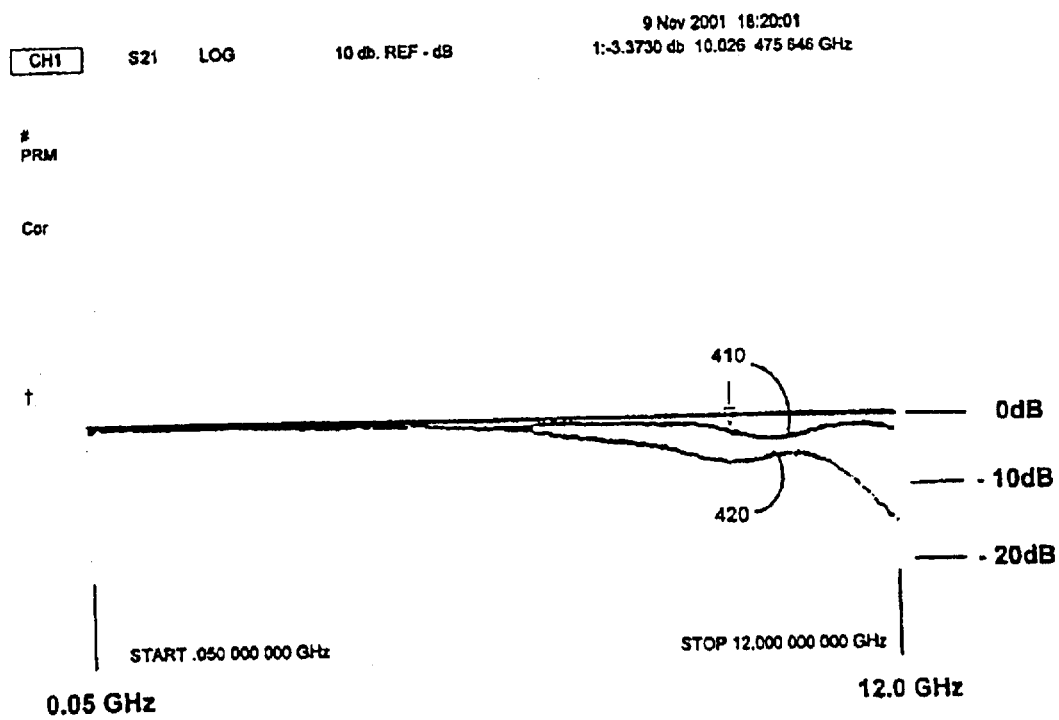
FIG. 4 is a graph comparison of the insertion loss between the two TO-can packages of FIGS. 2 and 3.

FIG. 4 is a graph comparison in the frequency domain of the insertion loss for the two TO-cans of FIG. 2(*a*) and FIG. 3(*a*) demonstrating reduced external parasitics. Again external parasitics were reduced by shortening the TO-can package posts thereby eliminating substantially any physical space or the gap between the TO-can package and the adjoining PC board. As shown in FIG. 4, the graph plots insertion loss vs. frequency for each TO-can package. A curve 410 shows the relatively low insertion loss of the TO-can of FIG. 3(*a*), and another curve 420 shows the insertion loss of the TO-can of FIG. 2(*a*). The installation of a transmission line with shorter bond wires inside the TO-can of FIG. 3(*a*) however extends its usable speed to approximately 12 GHz in accordance with the concepts of the invention.

The modifications described herein provide TO-can packages that are inherently usable at speeds up to and beyond 10 Gbps without any substantial structural modification. A 10 Gbps VCSEL may be installed within these widely accepted TO-can packages as described herein and mounted on a PC board. The undesirable parasitic effects which currently plague TO-can packages at high-speeds are significantly reduced by approaching the problem as provided herein from two different perspectives, external and internal parasitic minimization. External parasitics may be minimized by reducing the length of the posts and eliminating the physical gap between a TO-can package and the edge of a PC board. Internal parasitics can be reduced by providing a transmission line attached with relatively short end bond wires inside the TO-can in place of a single continuos bond wire.

Integrated Submounts

The VCSEL packaging provided herein may contain multiple lasers, monitor photodiodes or other photoelectronic components. Various components may be formed on a single chip to recognize certain cost-saving benefits and provide a smaller footprint. For example, it is possible to reduce the number of parts by combining the monitor diode with the transmission line segments on the same submount. Another distinct aspect of the disclosed invention provides integrated submounts positioned within the interior region of a TO-can package for integrating transmission lines and other optoelectronic elements inside the can.

Figure 5:
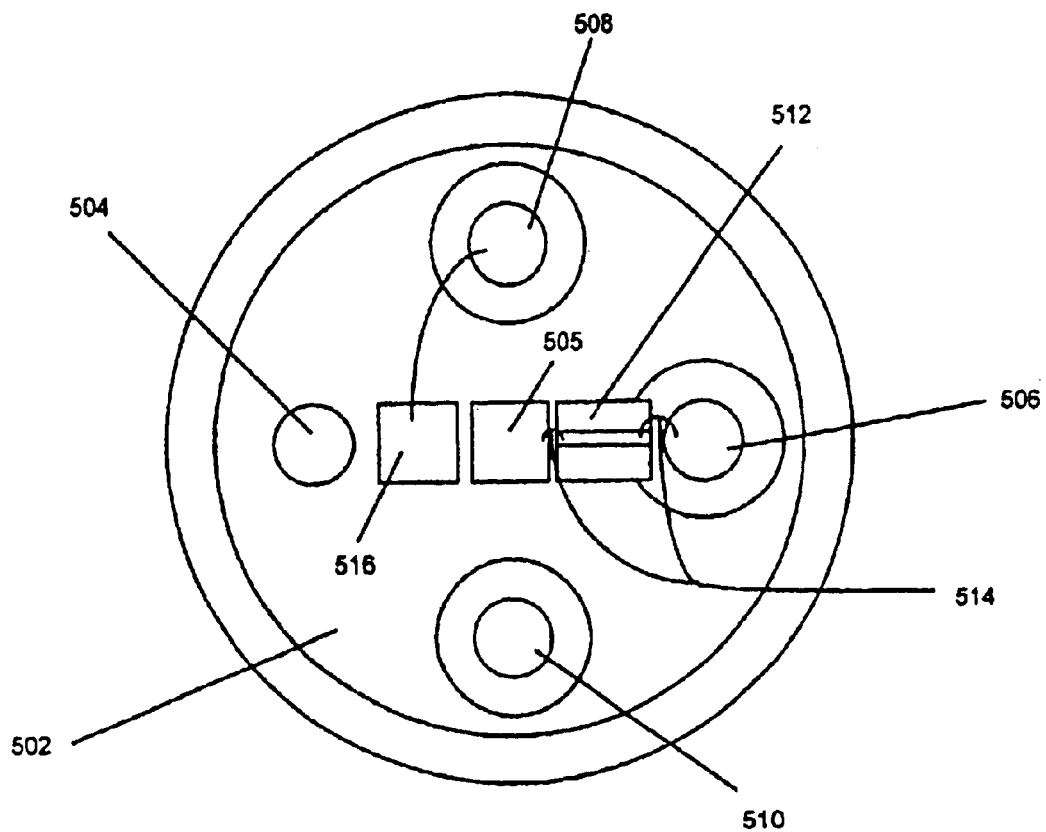
FIG. 5 is a drawing of a VCSEL TO-can package containing three separate mounted chips.

FIG. 5 is an illustration of a TO-can package provided in accordance with the current invention. The package cap or header 502 may be formed with a ground post 504 and several signal posts as described above. A post 506 may be dedicated for communication with a VCSEL 505 formed on the header 502, and another post 508 may be selected for a monitor photodiode 516. Another post 510 may be optionally connected to the monitor 516 or VCSEL 505 particularly when employing a differential driving technique for the laser. The post 506 for the laser may be connected to the VCSEL 505 with a transmission line 512 and two short bond wires 514. The transmission line assemblies described herein demonstrate the ability to significantly reduce the internal parasitics typically associated with using bond wires alone within conventional TO-can packages. These and other optoelectronic components may be encapsulated within TO-can packages and hermetically sealed as described herein to substantially reduce typical parasitic effects which become more pronounced at high-speed data transfer rates.

Figure 6:
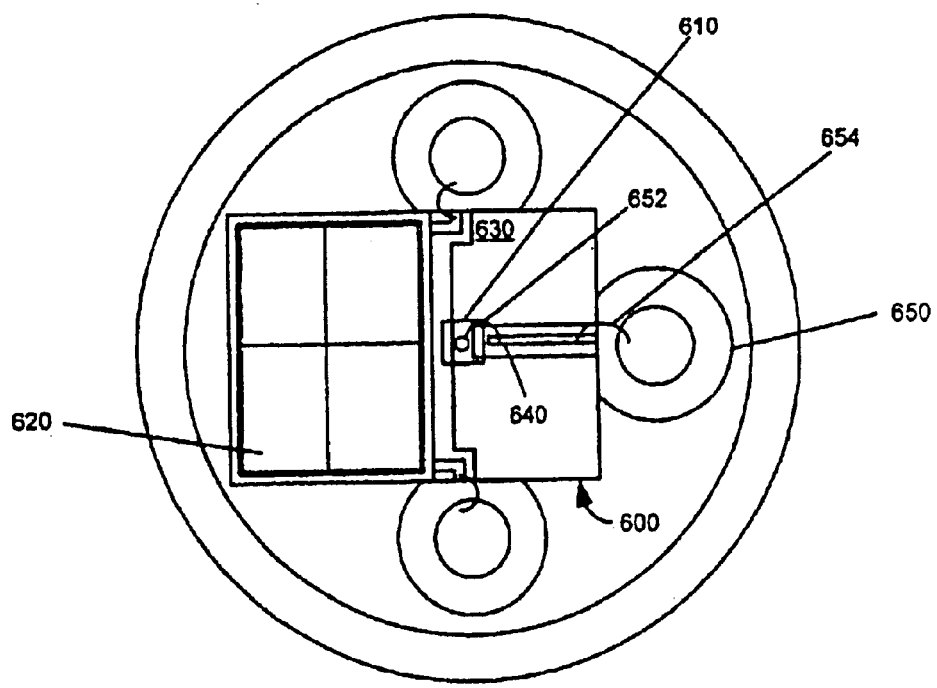
FIG. 6 provides a top view illustration of a VCSEL submount consisting of transmission lines and a monitor diode within a TO-can package.

FIG. 6 illustrates another embodiment of invention which includes a VCSEL submount 600. The submount 600 includes a monitor diode 620 and transmission lines for high-speed connection. The VCSEL 610 may be mounted or sit on a ground plane 630 of the submount 600. A transmission line 640 couples the VCSEL 610 to a signal post 650. A bond wire 652 may couple the VCSEL 610 and the transmission line 640. Another bond wire 654 may also couple the signal post 650 and the transmission line 640. The VCSEL submount may support various package contents and have complementary dimensions relative to certain TO-can packages. The transmission lines described herein may be used interchangeably with other interconnects that are modified to provide additional signal conditioning functions as may be desired.

Figure 15B:
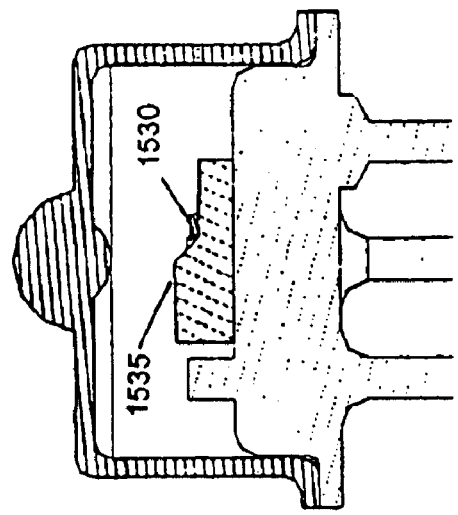
FIG. 15(b) shows a cross section view of a TO-46 can with an edge-emitting laser on a mirror submount.
Figure 15C:
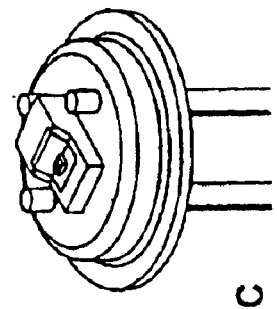
FIG. 15(c) shows a perspective view of the TO-46 can with the mirror submount, but without the cap.
Figure 15A:
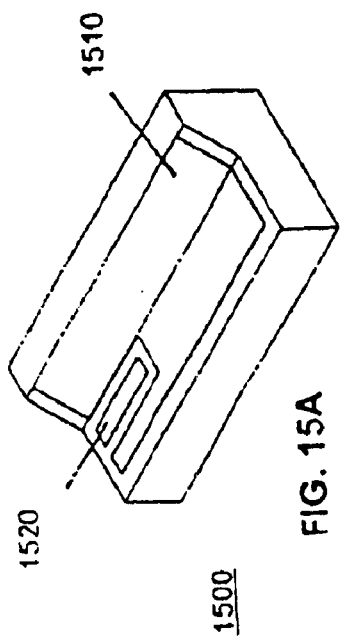
FIG. 15(a) illustrates a mirror submount.

FIG. 15(a) illustrates another embodiment of invention which includes a mirror submount 1500. The submount 1500 includes a mirror 1510 and one or more transmission lines 1520 for high-speed connection. FIG. 15(b) shows a cross section view of a TO-46 can 1525 with an edge-emitting laser 1530 on the mirror submount 1535. FIG. 15(c) again shows a perspective view of the TO-46 can with the mirror submount, but without the cap.

Figure 7A:
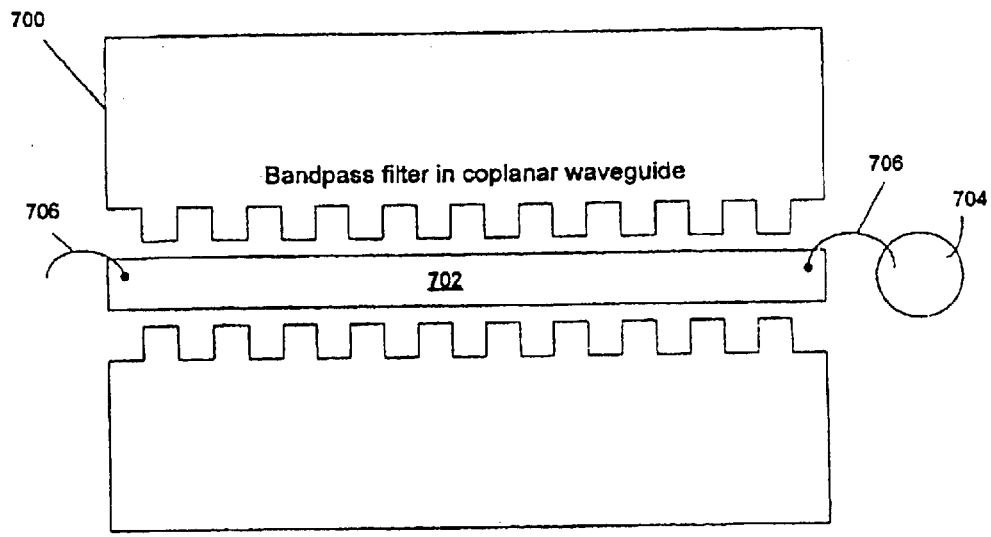
FIGS. 7(a) and (b) illustrate filters which may be installed between a laser component and post within a TO-can.
Figure 7B:
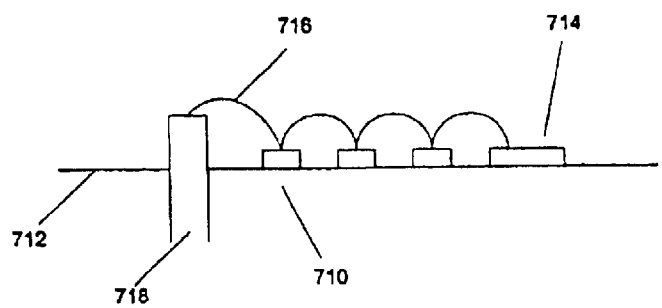
FIGS. 7(c) and (d) illustrate filters which may be installed at least partly on a printed circuit board.
Figure 7C:
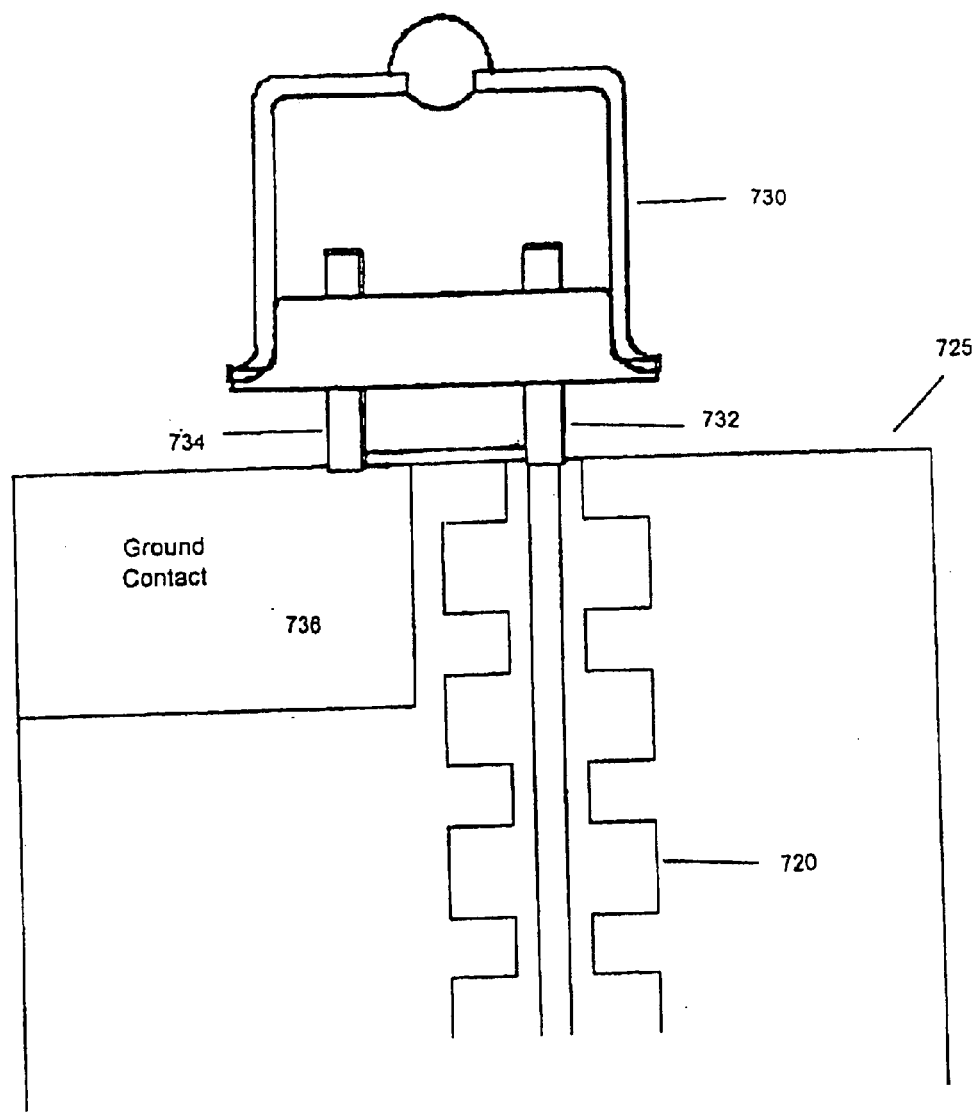
Figure 7D:
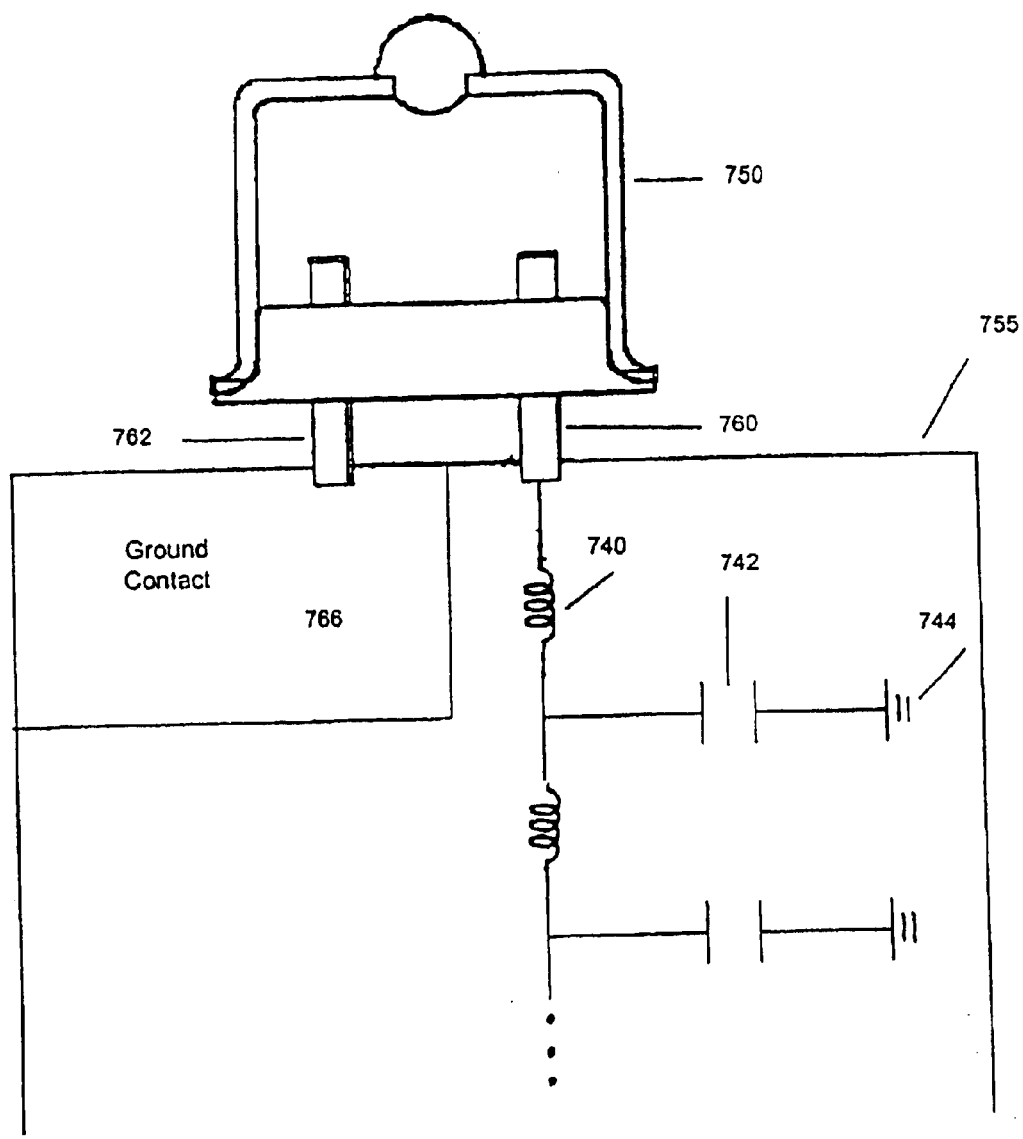
Figure 8:
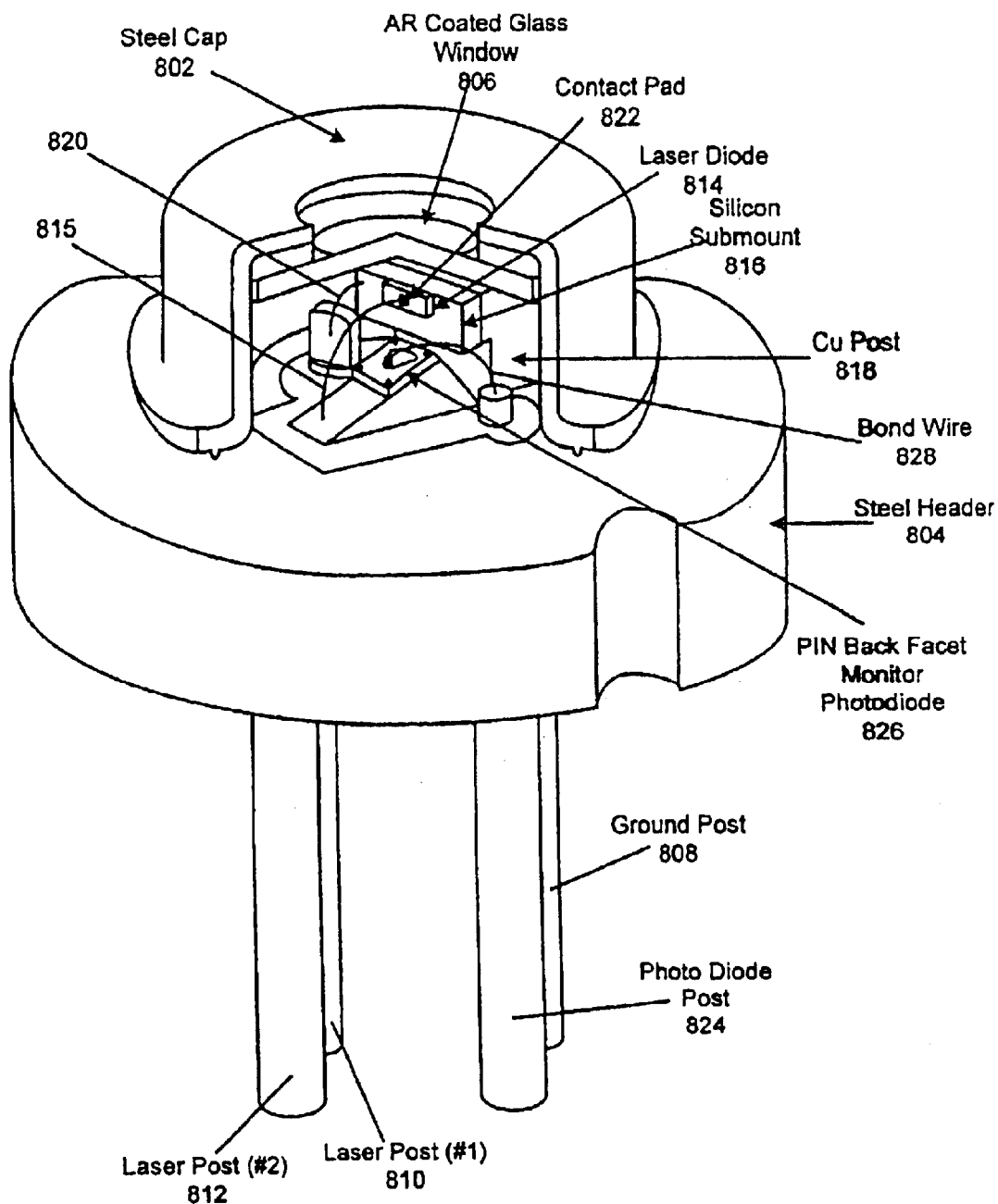
FIG. 8 is a perspective drawing of an edge-emitting laser positioned on a submount which may be installed within a TO-can package such as a TO-56 package which may be modified in accordance with various concepts of the invention.

FIG. 7(a) illustrates a coplanar waveguide (CPW) bandpass filter assembly 700 which may be installed between a laser within a TO-can package and its corresponding postss. As described above, a waveguide 702 may be connected to the post 704 and the surface or edge emitting laser with relatively shortened bond wires 706. The particular geometry and dimensions of the bandpass filter may be modified in accordance with known methods depending on desired frequencies. The bandpass filter could allow only certain signals between specific frequencies to pass and discriminate against signals at other frequencies. As known by those skilled in the art, some bandpass filters may be modified herein with amplifiers that boost the levels of signals in the accepted frequency range. Such amplifiers may be connected to a source of power, which may be positioned within the TO-can package in accordance with the invention, to provide active bandpass filters. The invention may incorporate active, or passive bandpass filters as described above which neither amplify nor consume power in accomplishing the desired signal conditioning. Filters may be thus installed separately within the TO-can package or formed monolithically, or alternatively, a filter may be formed by lumped capacitors and bond wires. As shown FIG. 7(b), a series of multiple capacitors 710 may be also arranged along the base of a TO-can header or submount 712 which lead to the laser component 714. Several bond wires 716 may be used to establish the electrical connection between the laser 714 and its corresponding post 718. This structure is a low-pass filter whose cutoff frequency could be higher than 10 GHz. The elimination of a single long bond wire again reduces internal parasitics within the TO-can package. The particular geometries and number of the capacitors 710 connected by bond wires 716 herein for signal conditioning may be modified by known methods as may be required. FIG. 7(c) illustrates a coplanar waveguide bandpass filter 720 positioned on PCB 725. TO-can 730 has one post 732 coupled to the filter 720 and another post 734 coupled to the ground contact 736. FIG. 7(d) illustrates a filter including a series of inductors 740 and capacitors 742 positioned on PCB 755. TO-can 750 has one post 760 coupled to the filter and another post 762 coupled to the ground contact 766. As referenced above, many of the improvements provided herein are applicable to both vertical surface emitting lasers as well as edge emitting lasers. Available TO-can packages that contain edge emitting devices can also benefit from the inclusion of transmission lines as described herein to reduce parasitics and improve overall performance for relatively high-speed applications. FIG. 8 illustrates a TO-can package formed with a vertical submount that is adapted for edge emitting devices. A steel cap 802 and header 804 may be welded or otherwise joined together to form a hermetically sealed interior region. The steel cap 802 may be formed with an aperture that is covered by a glass window 806 which may be formed with a lens and/or suitable coatings. The header 804 may be formed with a ground post 808 for grounding the package. A pair of laser posts 810 and 812 may also extend through the header 804 into the interior region for connection to a laser diode 814. The laser 814 may be mounted vertically onto a silicon submount 816, which would otherwise be mounted ordinarily around the central portion of a header for surface emitting lasers. The submount 816 may further be supported by a copper post 818 within the package interior. The first laser post 810 may be electrically connected directly to the laser 814 with a bond wire 820. The second laser post 812 may be coupled to a contact pad portion 822 of the laser 814 with another bond wire 815. The second laser post 812 may be utilized for known differential driving mechanisms at certain data transfer rates. Moreover, a portion of the second laser post 812 extending inside the package interior may be formed as a wedge-like configuration as illustrated. A photodiode post 824 may also extend through the header 804 into the package interior for connection to a PIN back facet monitor photodiode or other photodetector 826. The photodiode 826 may be connected to its respective post with a bond wire 828.

In some embodiments, the cap and the header of are integrally formed. In other embodiments, the cap and the header are separately formed and then joined.

Figure 9A:
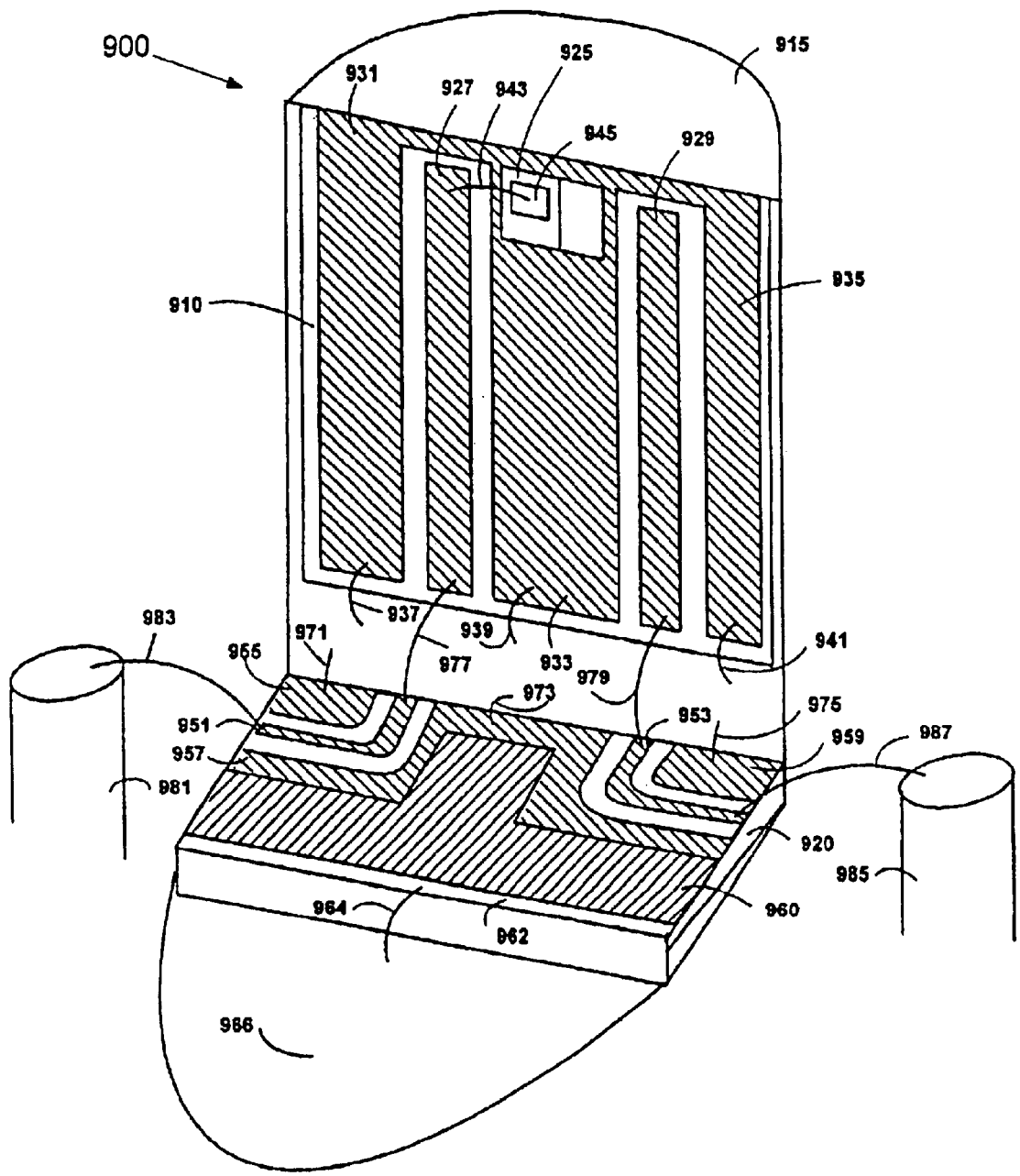
FIG. 9(a) shows a perspective view of part of an embodiment of a TO-can package with an edge emitting device and a photodetector.
Figure 9B:
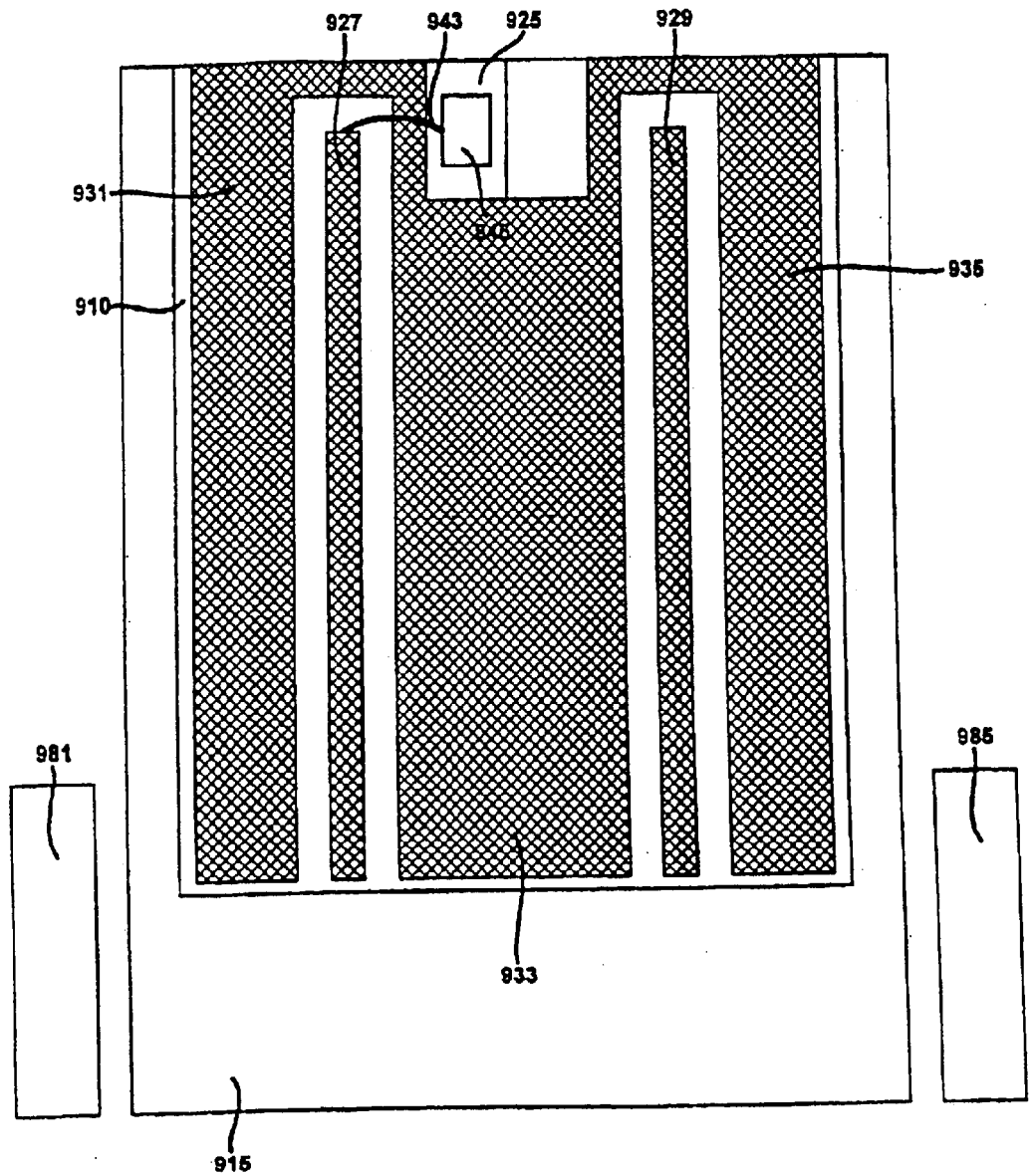
FIG. 9(b) shows a two dimensional view of a vertical submount of FIG. 9(a).
Figure 9C:
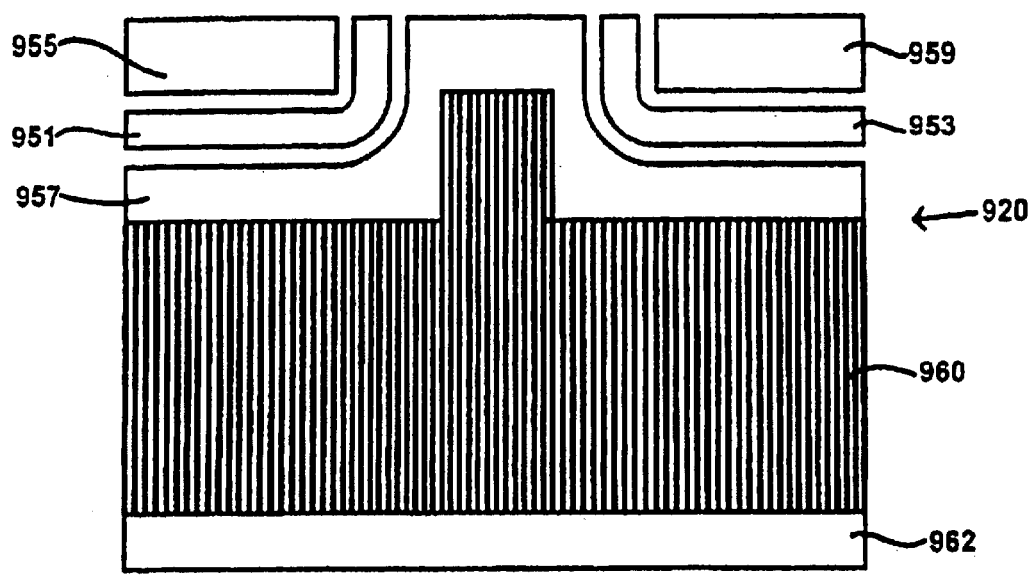
FIG. 9(c) shows a two dimensional view of a horizontal submount of FIG. 9(a).

FIG. 9(a) shows a perspective view a horizontal and a vertical submount that may be fitted within the interior of a TO-can package as shown in FIG. 8. The TO-can package may include a vertical submount 910 and a horizontal submount 920 as shown. The vertical submount 910 may be coupled to a post 915 and may serve as a mount or platform to support a laser diode 925 and transmission lines 927 and 929. Other embodiments of the vertical submount and the horizontal submount can include one transmission line, three transmission lines, or any plurality thereof In one embodiment of the invention, the transmission line may be a coplanar waveguide (CPW). The vertical submount 910 also includes grounds 931, 933, and 935, respectively coupled to the post 915 by bond wires 937, 939, and 941. A bond wire 943 couples the transmission line 927 to a laser contact 945. Other embodiments, such as with a differentially driven laser, can couple the laser to at least two transmission lines such as transmission lines 927 and 929. Additionally, the horizontal submount 920 may include transmission lines 951 and 953 and a photodetector 960. One embodiment of the photodetector is an MSM (metal semiconductor metal) photodetector. The transmission lines 951 and 953 can be curved to change direction and minimize discontinuities. The transmission line 951 is also coupled to the transmission line 927 by a bond wire 977, and the transmission line 953 is coupled to the transmission line 929 by another bond wire 979. The transmission line 951 is coupled to a post 981 by a bond wire 983, and the transmission line 953 is coupled to a post 985 by a bond wire 987. The horizontal submount 920 also includes grounds 955, 957, and 959, respectively coupled to the post 915 by bond wires 971, 973, and 975. A photodetector contact 962 is again coupled by a bond wire 964 to a post 966. The post 966 include the contact pad that the horizontal submount 920 sits on. Another post couples photodetector 960 to one of the posts, which is not shown. FIGS. 9(b) and (c) show two dimensional views of the vertical submount 910 and the horizontal submount 920 illustrated in FIG. 9(a), respectively, which include similar reference numerals used therein.

Figure 10:
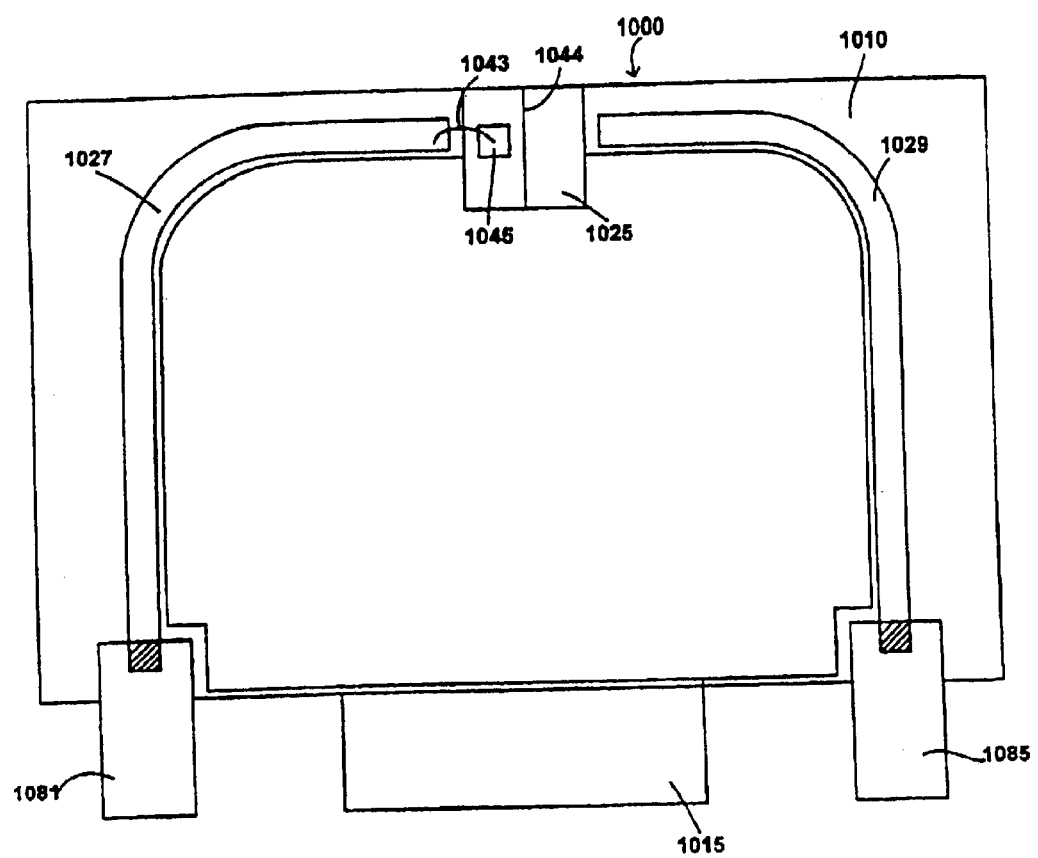
FIG. 10 shows a two dimensional view of part of another embodiment of a TO-can package with an edge emitting device.

FIG. 10 shows a two dimensional view of yet another embodiment of the invention provided herein. A TO-can package 1000 includes a vertical submount 1010 coupled to a post 1015. The vertical submount 1010 includes a laser diode 1025, and transmission lines 1027 and 1029. A bond wire 1043 couples a laser contact 1045 to the transmission line 1027. The laser diode 1025 includes a laser channel 1044. In one embodiment, the transmission line is a CPW. Other embodiments of the invention which may incorporate a differentially driven laser can include at least two transmission lines coupled to the laser such as transmission lines 1027 and 1029. A first transmission line 1027 may be coupled to a post 1081, and a second transmission line 1029 may be coupled to a post 1085. A variety of bonding agents may be selected for coupling transmission lines to the posts with known epoxy and/or bonding materials.

In some embodiments that are differentially driven, geometrical symmetry should be maintained the differential lines, because unequal lengths and parasitic reactances of the signal lines can destroy the balance of the differential signal.

In some embodiments, to avoid radiative interference between various signal lines, RF absorber material can be placed on the PC board or close to the board in the enclosure.

Some embodiments compensate for parasitics with additional circuit elements. The parasitics can at least partly be "absorbed" into a low-pass filter or an "artificial transmission line". One embodiment includes a filter with multiple series inductors and shunt capacitors, allowing the parasitics to provide a few of the elements. The remaining elements may be incorporated into the PC-board and/or the device submount. A quick way to verify this approach is to add 0.25 pF shunt capacitors at the input and output ports of a TO-46 package that has 2.5 to 3.0 millimeters of offset from the board and notice a 2.0 GHz improvement in its bandwidth.

The RF cavity formed within a TO-46 is small enough that its lowest order resonance should not be of concern at 10 Gbps. The first order resonance of a pillbox cavity is at the wavelength of 1.3 times its inside diameter. For a TO-46 with an inside diameter of 4.22 mm, the first cavity resonance occurs at 55 GHz. The inclusion of chips and submounts in the package reduces the resonance frequency, but normally not to the extent that would be of concern at 10 Gbps. Bandwidth limitations observed in practice for some embodiments of the TO-46 are in the range of 3–4 GHz and are caused largely by parasitic reactances. Some reactances are inherent in the structure of the package and cannot be altered without redesigning the TO-can. Other reactances are determined by the assembly of parts inside the TO-can and by the assembly of the TO-can on the PC board.

Figure 12:
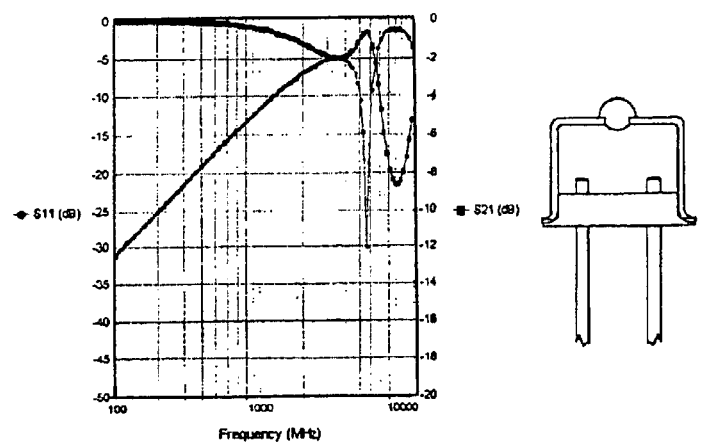
FIG. 12. The schematic diagram of a TO-46 Can and its frequency response. Its bandwidth is approximately 3 GHz.

The simulated performance of a conventional TO-46 shows the familiar bandwidth limitation of approximately 3 GHz or roughly 4 Gbps. This is shown in FIG. 12.

Figure 13:
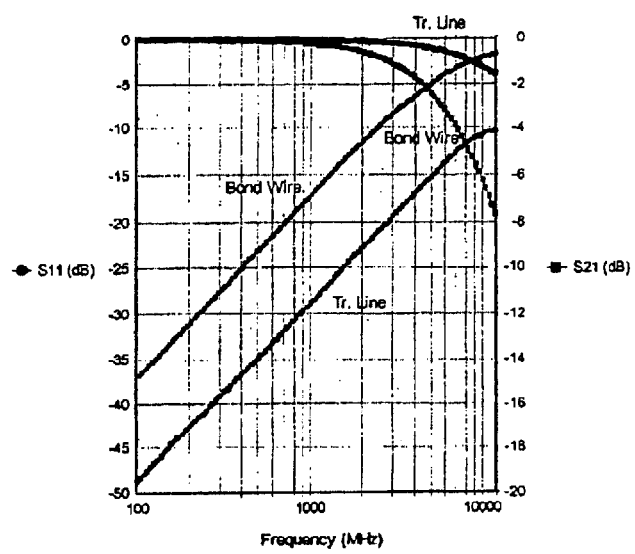
FIG. 13. Simulated response of a TO-46 package when two adjacent posts connected by a bond wire, and when they are connected by a 50-ohm transmission line. There is no external post-inductance in either case.

The effects of reducing the bond-wire inductance inside the TO-can package and reducing the post inductance outside of it may be examined. In the simulation shown in FIG. 13 the TO-can is touching the PC board. This zero offset assembly minimizes the external parasitics. Some embodiments have an offset distance between the printed circuit board and the TO-can header of less than 0.1 millimeter. In addition to this, two cases are compared: one with a bond wire connection inside the TO-can package and the other with a 50-ohm transmission line connection. For the bond-wire connection, the insertion loss at 12 GHz is approaching 8 dB, while with the 50-ohm transmission line the insertion loss is less than 2 dB. Thus, reduction of parasitics can be achieved.

Figure 14:
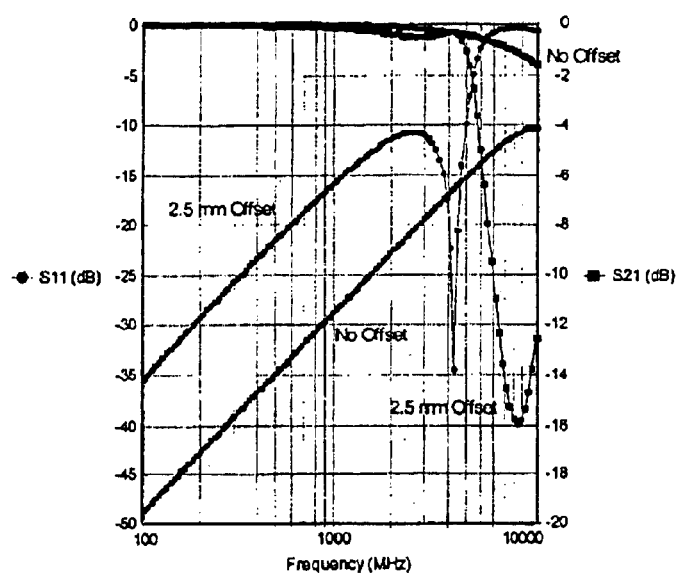
FIG. 14. Simulated response of a TO-46 Can when two adjacent posts connected by a 50-ohm transmission line. In one case, the TO-can is touching the PC board; in the other case it is offset by 2.5 mm.

FIG. 14 shows the effect of post inductance alone. The connection inside the TO-can is a 50-ohm transmission line. In one case, there is no post inductance and the TO-can package is physically touching the PC board. In the other case, there is a 2.5 mm offset distance between the bottom of the TO-can (from the bottom of the TO-can header), and the edge of the PC board.

It can be seen that post inductance plays a stronger role in limiting the bandwidth of the TO-can package than internal parasitics. The elimination of bond-wire parasitics and post inductances extends the usable bandwidth to 12 GHz and the TO-can can be used at data rates up to 16 Gbps. Some bond wire and/or external post inductance are tolerable at 10 Gbps. In one embodiment, the offset distance is below one millimeter and bond wire lengths below 500 microns.

Figure 11:
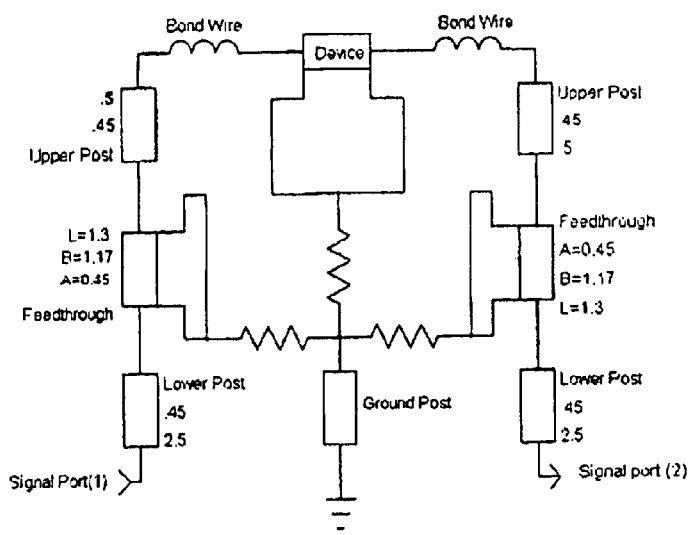
FIG. 11. Lumped element model of TO-46 consists of 10 discrete elements.

A TO-46 can be modeled as a two-port network. This was done by connecting a two-port device to two adjacent posts of the TO-can package. The third post was ignored. The two-port device was chosen to be either a 50-ohm transmission line or a single bond-wire. The lumped element model developed for this configuration is shown in FIG. 11. The model was used to predict the RF properties of the TO-46 package.

Based on the foregoing, various TO-can style packages are provided which may be adapted for high-speed data transfer rates in accordance with the present invention. While the present invention has been described in this disclosure as set forth above, it shall be understood that numerous modifications and substitutions can be made without deviating from the true scope of the present invention as would be understood by those skilled in the art. Therefore, the present invention has been disclosed by way of illustration and not limitation, and reference should be made to the following claims to determine the scope of the present invention.

What is claimed is:

1. An optoelectronic apparatus comprising:
   a TO-can cap and a TO-can header defining an interior region;
   a plurality of posts connected to the TO-can header;
   a laser mounted in the interior region; and
   an electrical path coupling the laser and at least one of the posts, wherein the electrical path includes a transmission line with a predetermined impedance that is formed with a conductive element other than a bond wire having a predefined length for reducing parasitic effects within the optoelectronic apparatus, and wherein the transmission line itself is connected to the laser and a post with a plurality of bond wires.

2. The apparatus of claim 1, wherein a total length of the two or more bond wires is less than 600 micrometers.

3. The apparatus of claim 1, wherein the predetermined impedance is 50 ohms.

4. The apparatus of claim 1, wherein the transmission line includes a coplanar waveguide.

5. The apparatus of claim 1, wherein the transmission line includes a lowpass filter.

6. The apparatus of claim 1, wherein the electrical path further includes at least a second transmission line coupled to the laser.

7. The apparatus of claim 6, wherein the first transmission line and the second transmission line are used to differentially drive the laser.

8. The apparatus of claim 1, further comprising a submount in the interior region, and the transmission line is on the submount.

9. The apparatus of claim 8, further comprising one or more monitors mounted on the submount.

10. The apparatus of claim 8, further comprising one or more mirrors on the submount.

11. The apparatus of claim 1, wherein the electrical path includes:
at least one bond wire having a diameter exceeding 17 microns.

12. The apparatus of claim 1, wherein the electrical path includes:
at least two parallel bond wires.

13. The apparatus of claim 1, wherein the electrical path includes:
a bond ribbon.

14. The apparatus of claim 1, wherein the electrical path includes:
a plurality of bond wires and at least one capacitor, the plurality of bond wires and the at least one capacitor coupled in series,
wherein the at least one capacitor is coupled to ground.

15. The apparatus of claim 1, wherein the laser is a vertical cavity surface emitting laser.

16. The apparatus of claim 1, wherein the laser is an edge emitting laser.

17. The apparatus of claim 1, wherein the laser is driven at a rate of at least 10 Gbps at a first time.

18. The apparatus of claim 1, further comprising a circuit board, wherein the optoelectronic package is mounted on the circuit board, and the optoelectronic package receives one or more electrical signals via one or more transmission lines of the circuit board.

19. An optoelectronic apparatus comprising:
a TO-can cap and a TO-can header defining an interior region;
a plurality of posts connecting the TO-can header to a printed circuit board which include a signal post;
a laser mounted in the interior region of the TO-can header and the TO-can cap, and
a transmission line configured for coupling the signal post and the laser mounted in the interior region of the TO-can header and the TO-can cap, wherein the transmission line is formed with a conductive element of a predetermined length other than a bond wire for reducing parasitic effects within the optoelectronic apparatus, and wherein the transmission line itself is connected using a plurality of bond wires to the laser and the signal post.

20. The apparatus of claim 19, further comprising a printed circuit board, wherein the optoelectronic apparatus is mounted on the printed circuit board.

21. The apparatus of claim 19, wherein an offset distance between the printed circuit board and the TO-can header is less than 1 millimeter.

22. The apparatus of claim 19, further comprising:
a lowpass filter, the lowpass filter including;
a first portion at least partly on the printed circuit board; and
a second portion coupled to the first portion, the second portion including at least one post of the plurality of posts.

23. The apparatus of claim 19, further comprising:
a coplanar waveguide bandpass filter on the printed circuit board, the coplanar waveguide bandpass filter coupled to at least one post of the plurality of posts.

24. The apparatus of claim 19, wherein the laser is a vertical cavity surface emitting laser.

25. The apparatus of claim 19, wherein the laser is an edge emitting laser.

26. The apparatus of claim 19, wherein the laser is driven at a rate of at least 10 Gbps at a first time.

27. An optoelectronic apparatus comprising:
a TO-can cap and a TO-can header defining an interior region;
a plurality of posts connected to the TO-can header;
a photodetector mounted in the interior region; and
an electrical path coupling the photodetector and at least one of the posts, wherein the electrical path includes a transmission line with a predetermined impedance that is formed with a conductive element other than a bond wire having a predefined length for reducing parasitic effects within the optoelectronic apparatus. and wherein the transmission line itself is connected to the photodetector and a post with a plurality of bond wires.

28. The apparatus of claim 27, further comprising:
a transimpedance amplifier in the interior region, the transimpedance amplifier coupled to the photodetector.

29. The apparatus of claim 27, wherein a total length of the two or more bond wires is less than 600 micrometers.

30. The apparatus of claim 27, wherein the predetermined impedance is 50 ohms.

31. The apparatus of claim 27, wherein the transmission line includes a coplanar waveguide.

32. The apparatus of claim 27, wherein the transmission line includes a bandpass filter.

33. The apparatus of claim 27, wherein the electrical path further includes at least a second transmission line coupled to the photodetector.

34. The apparatus of claim 27, further comprising a submount in the interior region, and the transmission line is mounted on the submount.

35. The apparatus of claim 27, wherein the electrical path includes:
at least one bond wire having a diameter exceeding 17 microns.

36. The apparatus of claim 27, wherein the electrical path includes:
at least two parallel bond wires.

37. The apparatus of claim 27, wherein the electrical path includes:
a bond ribbon.

38. The apparatus of claim 27, wherein the electrical path includes:
a plurality of bond wires and at least one capacitor, the plurality of bond wires and the at least one capacitor coupled in series,
wherein the at least one capacitor is coupled to ground.

39. The apparatus of claim 27, wherein the photodetector receives data at a rate of at least 10 Gbps at a first time.

40. The apparatus of claim 27, further comprising a circuit board, wherein the optoelectronic package is mounted on the circuit board, and the optoelectronic package communicates one or more electrical signals via one or more transmission lines of the circuit board.

41. An optoelectronic apparatus comprising:
a TO-can cap and a TO-can header defining an interior region;
a plurality of posts connecting the TO-can header to a printed circuit board, including a signal post; and
a photodetector mounted in the interior region of the TO-can header and the TO-can cap, a transmission line configured for coupling the signal post and the photodetector mounted in the interior region of the TO-can header and the TO-can cap, wherein the transmission line is formed with a conductive element of a predetermined length other than a bond wire for reducing parasitic effects within the optoelectronic apparatus, and wherein the transmission line itself is connected using a plurality of bond wires to the photodetector and the signal post.

42. The apparatus of claim 41, further comprising a printed circuit board, and wherein the apparatus is mounted on the printed circuit board.

43. The apparatus of claim 41, wherein an offset distance between the printed circuit board and the TO-can header is less than 1 millimeter.

44. The apparatus of claim 41, further comprising:
a lowpass filter, the lowpass filter including:
a first portion at least partly on the printed circuit board; and
a second portion coupled to the first portion, the second portion including at least one post of the plurality of posts.

45. The apparatus of claim 41, further comprising:
a coplanar waveguide bandpass filter on the printed circuit board, the coplanar waveguide bandpass filter coupled to at least one post of the plurality of posts.

46. The apparatus of claim 41, wherein the photodetector communicates data at a rate of at least 10 Gbps at a first time.

47. An optoelectronic package comprising:
a TO-can cap and header assembly with a defined interior package region;
a plurality of posts connected to the header of the TO-can assembly; and
an electrical path that is configured for coupling at least one post with an optoelectronic component within the interior package region, wherein the electrical path includes a transmission line with controlled impedance that is formed with a conductive element other than a bond wire having a predefined length for reducing parasitic effects within the optoelectronic package, and wherein the transmission line itself is connected to the optoelectronic component and a post with a plurality of bond wires.

48. The optoelectronic package as recited in claim 47, wherein the optoelectronic component is a VCSEL.

49. The optoelectronic package as recited in claim 47, wherein the optoelectronic component is a photodetector.

50. The optoelectronic package as recited in claim 47, wherein an inductance between the optoelectronic component and the post is less than 600 picoHenries.

51. The optoelectronic package as recited in claim 47, wherein the transmission line is configured as a coplanar waveguide and lowpass filter.

52. The optoelectronic package as recited in claim 47, wherein the transmission line is configured as a microstrip or coplanar waveguide.

* * * * *